(12) United States Patent
Liu et al.

(10) Patent No.: US 8,846,302 B2
(45) Date of Patent: Sep. 30, 2014

(54) SEMICONDUCTOR STRUCTURE AND METHOD AND TOOL FOR FORMING THE SEMICONDUCTOR STRUCTURE

(75) Inventors: George Liu, Shin-chu (TW); Kuei Shun Chen, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 127 days.

(21) Appl. No.: 13/364,069

(22) Filed: Feb. 1, 2012

(65) Prior Publication Data
US 2013/0193564 A1 Aug. 1, 2013

(51) Int. Cl.
G03F 7/00 (2006.01)
H01L 21/00 (2006.01)

(52) U.S. Cl.
USPC .......................... 430/311; 430/259; 430/260

(58) Field of Classification Search
USPC ......................................... 430/311, 259, 260
See application file for complete search history.

(56) References Cited

U.S. PATENT DOCUMENTS

| | | | | |
|---|---|---|---|---|
| 5,328,798 A | * | 7/1994 | McCarthy et al. | 430/200 |
| 5,426,014 A | * | 6/1995 | Kelly et al. | 430/273.1 |
| 5,824,457 A | * | 10/1998 | Liu et al. | 430/394 |
| 5,879,838 A | * | 3/1999 | Lee | 430/5 |
| 5,965,925 A | * | 10/1999 | Kornachuk et al. | 257/401 |
| 6,309,805 B1 | * | 10/2001 | Carpenter | 430/322 |
| 7,407,824 B2 | * | 8/2008 | Kerr et al. | 438/22 |
| 8,465,994 B2 | * | 6/2013 | Kim | 438/34 |
| 2005/0196911 A1 | * | 9/2005 | Kim | 438/149 |
| 2006/0094246 A1 | * | 5/2006 | Whitefield et al. | 438/725 |
| 2009/0075217 A1 | * | 3/2009 | Brodsky | 430/327 |
| 2009/0102070 A1 | * | 4/2009 | Feger et al. | 257/797 |
| 2012/0114872 A1 | * | 5/2012 | Lu et al. | 427/535 |
| 2013/0147056 A1 | * | 6/2013 | Hogan et al. | 257/774 |

OTHER PUBLICATIONS

"Edge Bead Removal" copyright 2009 pp. 1, available online at: http://www.nanotech.ucsb.edu/index.php?option=com_content&view=article&id=164:edge-bead-removal.*
Niederman, Ph "A novel thick photoresist for microsystem technology" Microelectronic Engineering 67-68 (Jun. 2003) pp. 259-265.*
White, Robert "SU-8 Photoresist Processing SOP" pp. 1-5, available online as of Sep. 11, 2009 at: http://web.archive.org/web/20091109212654/http://engineering.tufts.edu/microfab/index_files/SOP/SU-8%20Processing.pdf.*
Photoresist entry in Wikipedia available as of Jun. 24, 2009 at http://en.wikipedia.org/w/index.php?title=Photoresist&oldid=298433988.*
SU-8 photoresist entry in Wikipedia available online as of Sep. 9, 2009 at http://en.wikipedia.org/w/index.php?title=SU-8_photoresist&oldid=312687329.*

* cited by examiner

Primary Examiner — Yu-Hsi D Sun
Assistant Examiner — Grant Withers
(74) Attorney, Agent, or Firm — Lowe Hauptman & Ham, LLP

(57) ABSTRACT

A method of forming a semiconductor structure includes forming a photoresist layer over a substrate. The photoresist layer includes a first material removable by a removal process. The first material at a guard band portion of the photoresist layer along an edge portion of the photoresist layer is converted to a second material. The second material is not removable by the removal process. Also, the first material at the edge portion of the photoresist layer is not converted to the second material. The guard band portion is farther from a periphery of the substrate than the edge portion. The removal process is performed to remove the first material after the conversion of the guard band portion.

19 Claims, 10 Drawing Sheets

US 8,846,302 B2

SEMICONDUCTOR STRUCTURE AND METHOD AND TOOL FOR FORMING THE SEMICONDUCTOR STRUCTURE

BACKGROUND

An integrated circuit (IC) chip incorporates millions of active and passive electrical components on a semiconductor substrate within an area usually less than 100 mm$^2$. Layers of materials are deposited, implanted, patterned, and/or removed in order to form the active and passive electrical components and interconnection structures of the IC chip. Usually, tens or even hundreds of similar or identical IC chips are arranged to be manufactured on a single wafer for efficient mass production. The larger the wafer size, the more IC chips can be manufactured on a single wafer, and thus the fabrication cost for each IC chip is lower.

On the other hand, an edge portion of the wafer tends to be more vulnerable to the handling of automated robot arms, various kinds of process variations, such as poor step-coverage when forming a film thereon, trapped voids when filling openings, or damages caused by material exposure, plasma-arcing, or other uniformity issues of the processes. These issues not only result in defective chips at the edge portion of the wafer. The defects, such as cracks or delaminated layers, at the edge portion of the wafer may further propagate inward toward the center of the wafer and thus lead to more defective chips at an inner portion of the wafer.

DESCRIPTION OF THE DRAWINGS

One or more embodiments are illustrated by way of example, and not by limitation, in the accompanying drawings, wherein elements having the same reference numeral designations represent like elements throughout. It is emphasized that, in accordance with the standard practice in the industry, various features may not be drawn to scale and are used for illustration purposes. In fact, the dimensions of the various features in the drawings may be arbitrarily increased or reduced for clarity of discussion.

FIGS. 4A-1-4F-2 are cross-sectional views and corresponding top views of a semiconductor wafer at various manufacturing stages in accordance with one or more embodiments.

DETAILED DESCRIPTION

The following disclosure provides many different embodiments, or examples, for implementing different features of the invention. Specific examples of components and arrangements are described below to simplify the present disclosure. These are, of course, examples and are not intended to be limiting. For example, the formation of a first feature over or on a second feature in the description that follows includes embodiments in which the first and second features are formed in direct contact, and also includes embodiments in which additional features are formed between the first and second features.

Figure 1:
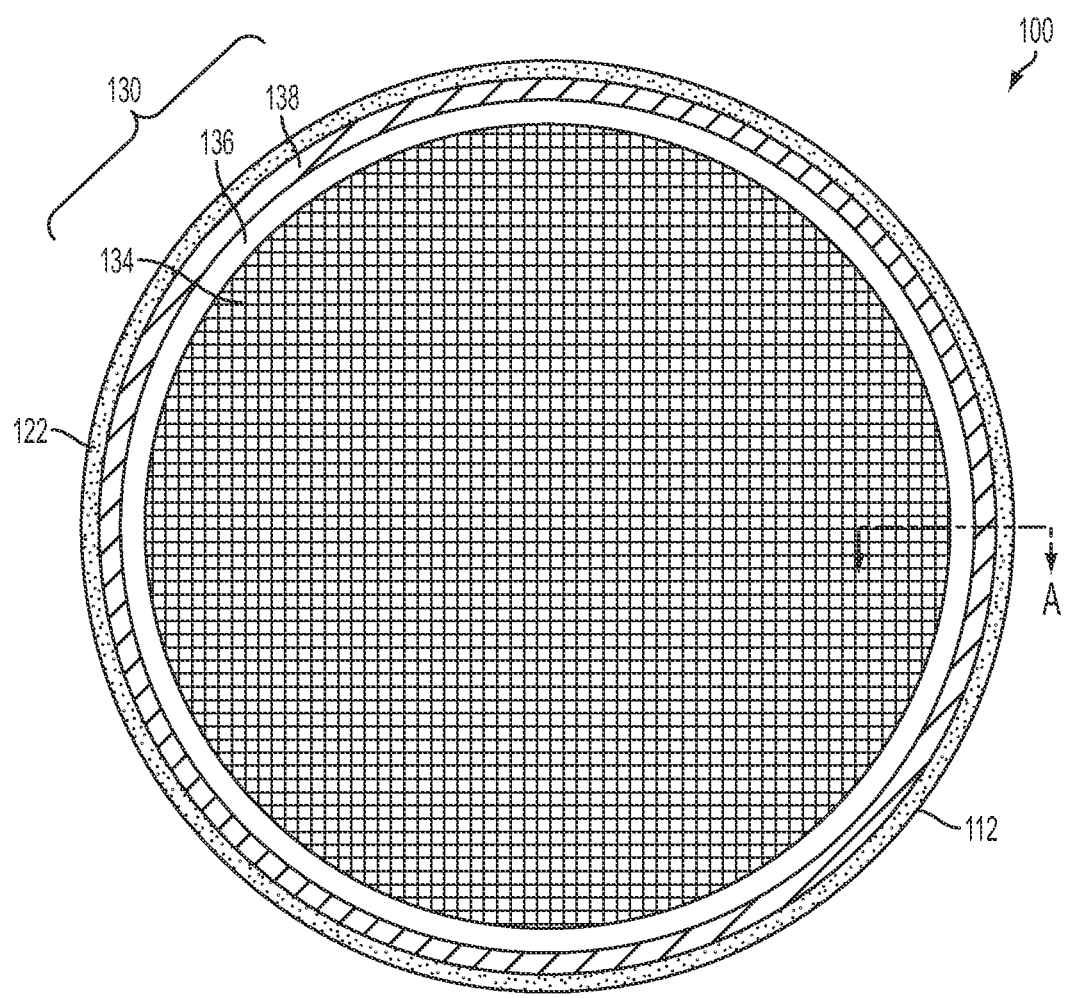
FIG. 1 is a top view of a semiconductor wafer in accordance with one or more embodiments.
Figure 2:
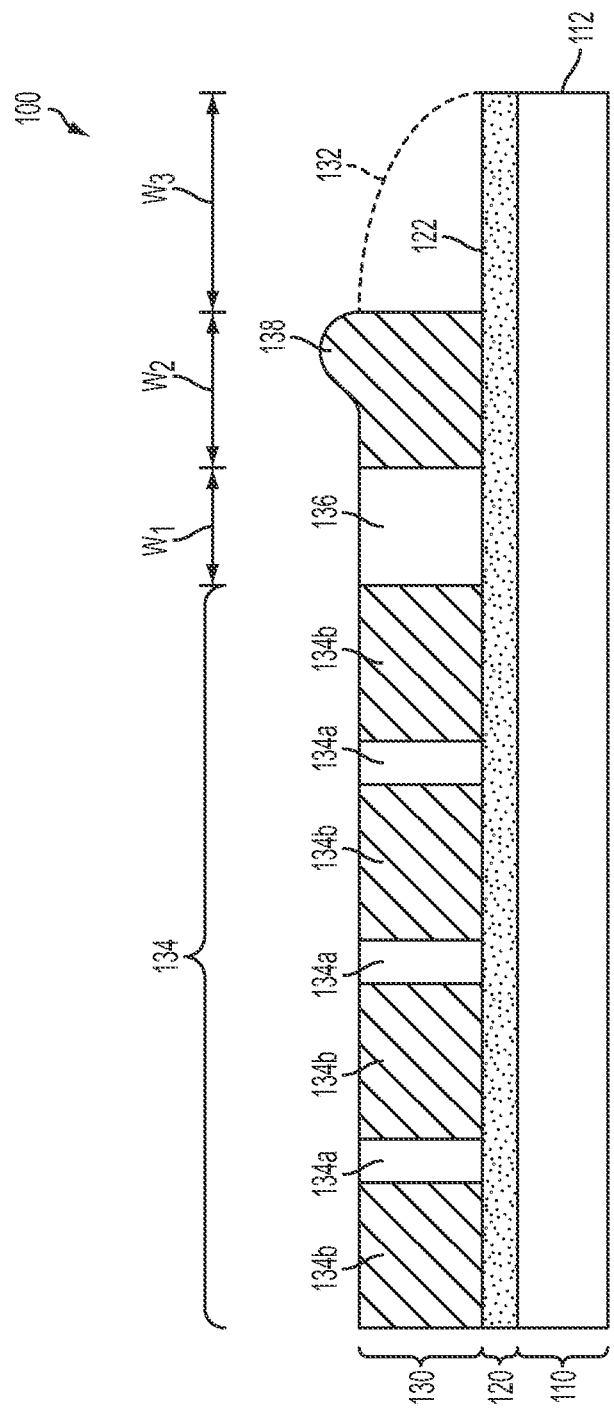
FIG. 2 is an enlarged cross-sectional view of a semiconductor wafer taken from line A in FIG. 1 in accordance with one or more embodiments.

FIG. 1 is a top view of a semiconductor wafer 100 while FIG. 2 is an enlarged cross-sectional view of a semiconductor wafer taken from line A in FIG. 1 in accordance with one or more embodiments. The semiconductor wafer 100 includes a substrate 110 having a periphery 112, a layer of material 120 over the substrate 110, and a photoresist layer 130 over the layer of material 120. The semiconductor wafer 100 is an intermediate product for manufacturing a plurality of IC chips. The photoresist layer 130 has been processed by a bead-edge removal (BER) process to have a bead-edge portion 132 (represented by the dotted line in FIG. 2) removed. Thus, an edge portion 122 of the layer of material 120 is not covered by the photoresist layer 130.

In some embodiment, the substrate 110 also includes electrical components formed over the substrate and/or one or more layers of interconnection structures. The layer of material 120 is processed according to a patterned version of the photoresist layer 130. In some embodiments, the layer of material 120 includes silicon nitride, silicon oxide, polysilicon, copper, aluminum, and/or other materials to be processed by an etching process, an implantation process, or any applicable semiconductor manufacturing process according to the patterned version of the photoresist layer 130. In some embodiments, the substrate 110 is processed using the patterned photoresist layer, and thus the layer of material 120 is omitted. In some embodiments, the photoresist layer 130 includes a polymer having acrylate or methacrylate monomer. In some embodiments, the photoresist layer 130 has a thickness ranging from 10 nm to 1000 nm.

The photoresist layer 130 includes at least an unexposed portion (such as 134b and edge portion 138 in FIG. 2) and an exposed portion (such as 134a and guard band portion 136 in FIG. 1). The exposed portion 134a or 136 of the photoresist layer 130 has been exposed to an electromagnetic radiation source for a predetermined duration sufficient to convert unexposed photoresist material into exposed photoresist material. The unexposed photoresist material is removable by a predefined removal process, and the exposed photoresist material is not removable by the predefined removal process. In some embodiments, an unexposed photoresist material having the characteristic that an exposed photoresist material converted therefrom remains while the unexposed photoresist material is being removed is also known as a negative tone photoresist material.

The photoresist layer 130 includes an inner portion 134, a guard band portion 136 surrounding the inner portion 134, and an edge portion 138 surrounding the guard band portion 136 of the photoresist layer 130. In other words, the guard band portion 136 is farther from the periphery 112 of the substrate 110 than the edge portion 138 of the photoresist layer 130.

In some embodiments, the edge portion 138 includes unexposed photoresist material, and the guard band portion 136 includes exposed photoresist material. In some embodiments, the inner portion 134 is patterned by performing a lithographic process according to a mask to selectively convert a portion of unexposed photoresist material into exposed photoresist material, and thus form exposed portions 134a and unexposed portions 134b within the inner portion 134. The exposed portions 134a and the unexposed portions 134b are patterned according to the mask.

The unexposed photoresist material at unexposed portions 134b and the edge portion 138 is removed in a removal process and leaves the guard band portion 136. The exposed photoresist material at the exposed portions 134a within the inner portion 134 remains as a layer of blocking material for the construction of the IC chips. In some embodiments, by removing the edge portion 138 of the photoresist layer 130 and forming the guard band portion 136 surrounding the inner portion 134, cracks or defects developed at the edge portion 138 of the patterned photoresist layer 130 are removed. Also, further propagation of these defects and cracks from the edge portion 138 of the patterned photoresist layer 130 into the inner portion 134 is prevented.

As depicted in FIG. 1, the guard band portion 136 has a circular shape and a uniform width. In some embodiments, the guard band portion 136 is non-uniform in shape and/or width. In some embodiments, the guard band portion 136 has a width $W_1$ ranging from 0.1 mm to 5.0 mm. In some embodiments, the edge portion 138 of the photoresist layer 130 has a width $W_2$ ranging from 0.1 mm to 5.0 mm. In some embodiments, a distance $W_3$ from an outer edge of the edge portion 138 of the photoresist layer 130 to the periphery 112 of the substrate 110 (sometimes also referred to as a width of the edge-bead portion 132) ranges from 0.1 mm to 5.0 mm.

Figure 3:
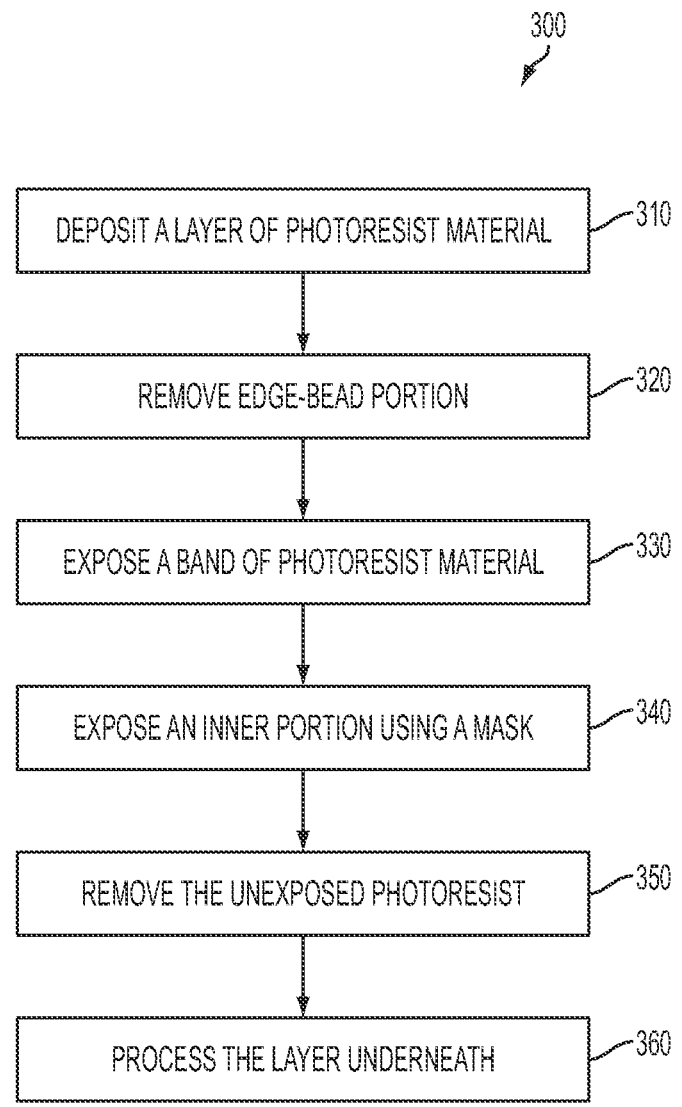
FIG. 3 is a flow chart of a method of forming a semiconductor structure in accordance with one or more embodiments.

FIG. 3 is a flow chart of a method 300 of forming a semiconductor structure in accordance with one or more embodiments. It is understood that additional processes may be performed before, during, and/or after the method 300 depicted in FIG. 3, and that some other processes may only be briefly described herein. The embodiment depicted in FIG. 2 is also referred to in furtherance of the description of the method 300.

In operation 310, a layer of photoresist material for forming the photoresist layer 130 is formed over a substrate 110 and a layer of material 120. In some embodiments, the layer of photoresist material is formed by performing a spin-coating process. In operation 320, an edge-bead portion 132 of the layer of photoresist material is removed by performing an edge-bead removal (EBR) process. In operation 330, at least a guard band portion 136 of the photoresist layer 130 along an edge portion 138 of the photoresist layer 130 is exposed to electromagnetic radiation. The guard band portion 136 is surrounded by the edge portion 138 and farther from a periphery 112 of the substrate 110 than the edge portion 138 of the photoresist layer 130. Meanwhile, the edge portion 138 of the photoresist layer 130 is prevented from being exposed to the electromagnetic radiation.

In operation 340, an inner portion 134 of the photoresist layer 130 is selectively exposed to the electromagnetic radiation by using a mask. In some embodiments, operation 340 is performed prior to the performance of operation 330. In at least one embodiment, operation 330 and 340 are performed concurrently.

In operation 350, a removal process is performed to remove the unexposed portion 138 and/or 134b of the photoresist layer 130. In some embodiments, the removal process is a photoresist development process. In at least one embodiment, the photoresist development process includes dipping the semiconductor wafer 100 in a development solution to dissolve the unexposed photoresist material at unexposed portions 138 and/or 134b, and then rinsing the semiconductor wafer 100 to remove the development solution and the unexposed photoresist material dissolved therein. In some embodiments, the photoresist material includes a polymer having acrylate or methacrylate monomer, and the development solution includes an acetate-based solution.

In operation 360, after the removal process for removing unexposed photoresist material, the layer of material 120 or the substrate 110 underneath the photoresist layer 130 is processed according to a patterned version of the photoresist layer 130. The layer of material 120 or the substrate 110 is etched or implanted using the patterned photoresist layer as a mask. In some embodiments, prior to operation 350, the patterned photoresist layer is further heated to strengthen the remaining exposed photoresist portion of the photoresist layer 130.

FIGS. 4A-1-4F-2 are cross-sectional views and corresponding top views of a semiconductor wafer 400 at various manufacturing stages in accordance with one or more embodiments.

Figures 1, 4A:
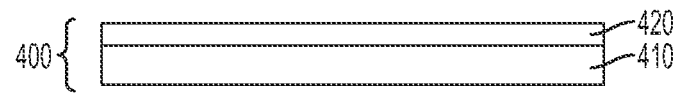
Figures 2, 4A:
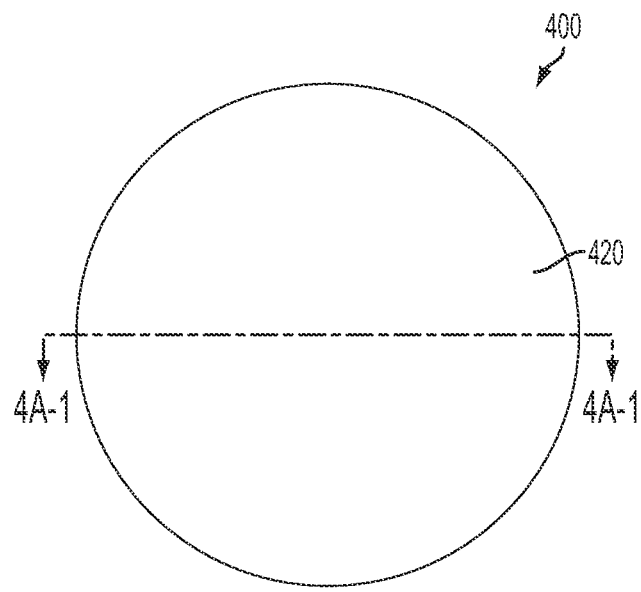

As depicted in FIGS. 4A-1 and 4A-2, a layer of material 420 to be subsequently processed is formed over a substrate 410. In some embodiments, the layer of material 420 includes silicon nitride, silicon oxide, polysilicon, copper, aluminum, and/or other materials to be processed by an etching process, an implantation process, or any applicable semiconductor manufacturing process according to a patterned photoresist layer 430' (FIG. 4F-1). In some embodiments, the substrate 410 is to be processed using the patterned photoresist layer 430' (FIG. 4F-1), and thus the formation of the layer of material 420 is omitted.

Figures 1, 4B:
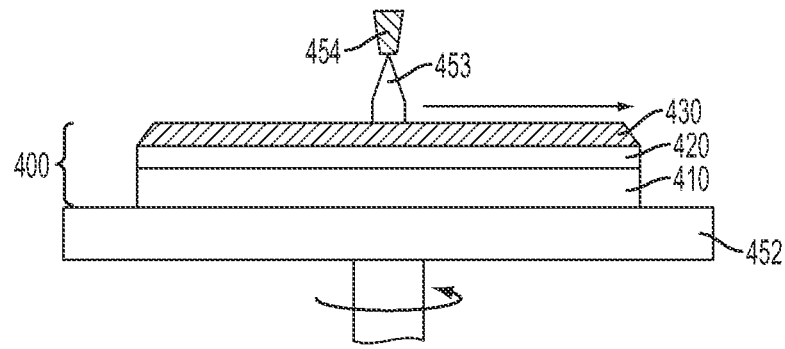
Figures 2, 4B:
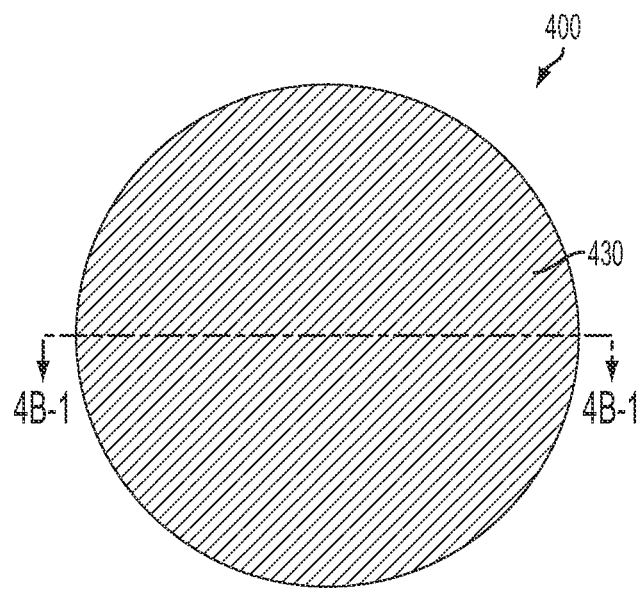

As depicted in FIGS. 4B-1 and 4B-2, a layer of photoresist material 430 is formed over the substrate 410 and the layer of material 420 (operation 310). In some embodiments, the formation of the layer of photoresist material 430 is performed by a spin-coating process. For example, the wafer 400 is placed on a chuck 452, a predetermined amount of unexposed photoresist material 453 is placed over the substrate 410 and the layer of material 420 by a nozzle 454, and the chuck 452 is rotated to cause the unexposed photoresist material 453 to be evenly coated over an upper surface of the wafer 400.

Figures 1, 4C:
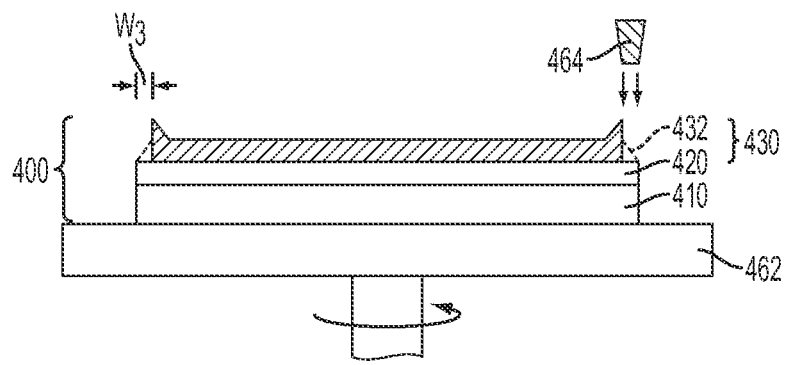
Figures 2, 4C:
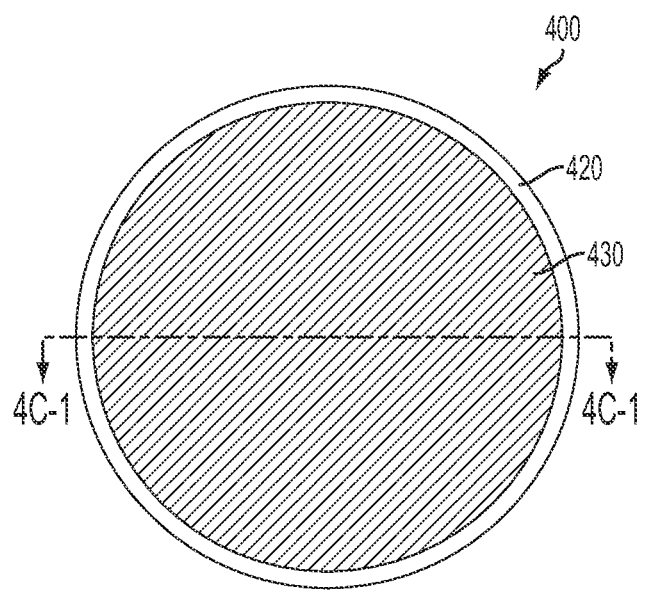

As depicted in FIGS. 4C-1 and 4C-2, an edge-bead portion 432 of the layer of photoresist material 430 is removed by performing an edge-bead removal (EBR) process (operation 320). In the embodiment depicted in FIGS. 4C-1 and 4C-2, the edge of the layer of photoresist material 430 after performing EBR has a bump shape because of swelling of the photoresist material.

In some embodiments, the EBR process is performed by placing the wafer 400 on a chuck 462, and then spinning the wafer 400 while removing the edge-bead portion 432 of the layer of photoresist material 430 using an EBR tool 464. In some embodiments, the EBR tool 464 is a nozzle placed at a predetermined position and configured to spray a solution onto a section of the edge-bead portion 432 of the layer of photoresist material 430. In some embodiments, the EBR tool 464 is a laser device placed at a predetermined position and emitting a laser beam onto a section of the edge-bead portion 432 of the layer of photoresist material 430. In at least one embodiment, the EBR process is performed by the same device for spin-coating the photoresist material, and thus the chuck 462 is the chuck 452. In some embodiments, a width of the edge-bead portion 432 (e.g., width $W_3$ in FIG. 2) ranges from 0.1 mm to 5.0 mm.

Figures 1, 4D:
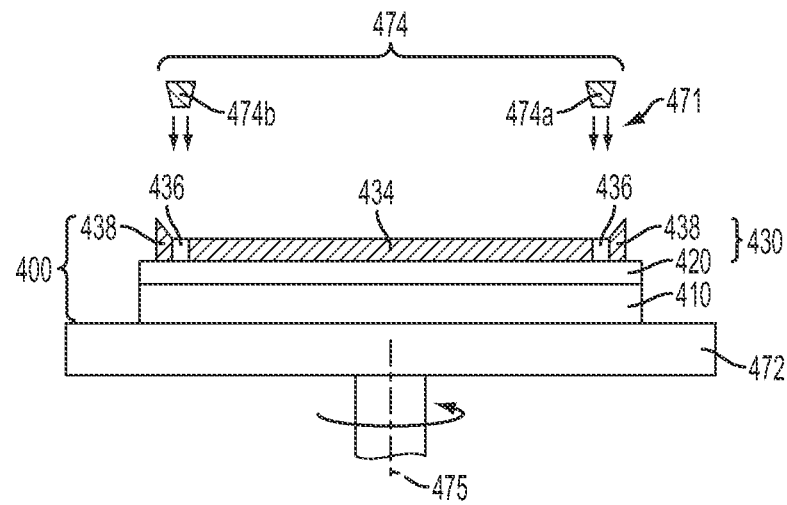
Figures 2, 4D:
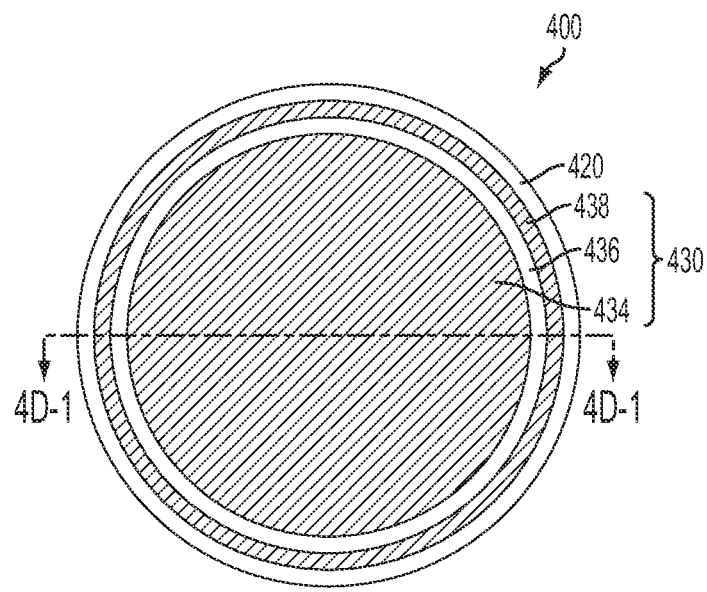

As depicted in FIGS. 4D-1 and 4D-2, a guard band portion 436 of the layer of photoresist material 430 along an edge portion 438 of the layer of photoresist material 430 is exposed to electromagnetic radiation 471 (operation 330). In some embodiments, the wafer 400 is placed on a platform, such as a chuck 472. An exposure unit 474 comprises two electromagnetic radiation emitting devices 474a and 474b symmetrically positioned around an axis 475 of the chuck 472. The exposure unit 474 emits the electromagnetic radiation 471 onto the guard band portion 436 of the photoresist layer 430. The exposure of the guard band portion 462 to the electromagnetic radiation 471 is sufficient to convert the unexposed photoresist material to an exposed photoresist material. In at least one embodiment, the unexposed photoresist material is removable by a photoresist development process, and the exposed photoresist material is not removable by the same photoresist development process. In some embodiments, there are more than two electromagnetic radiation emitting devices in the exposure unit 474. In some embodiments, there is only one electromagnetic radiation emitting device in the exposure unit 474.

Figures 1, 4E:
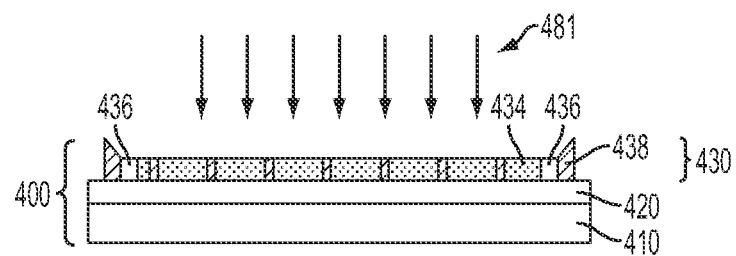
Figures 2, 4E:
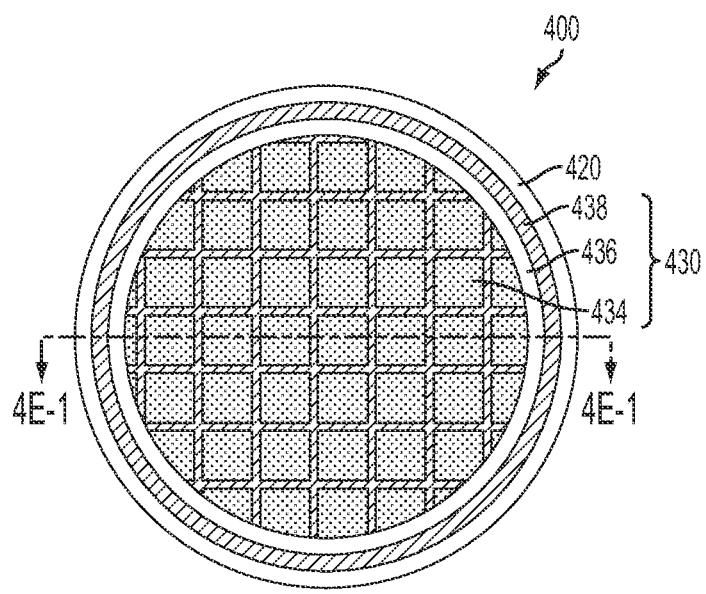
Figures 1, 4F:
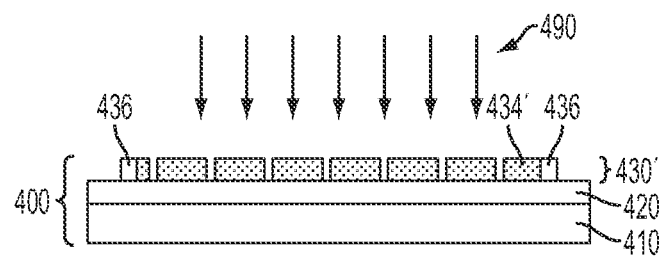
Figures 2, 4F:
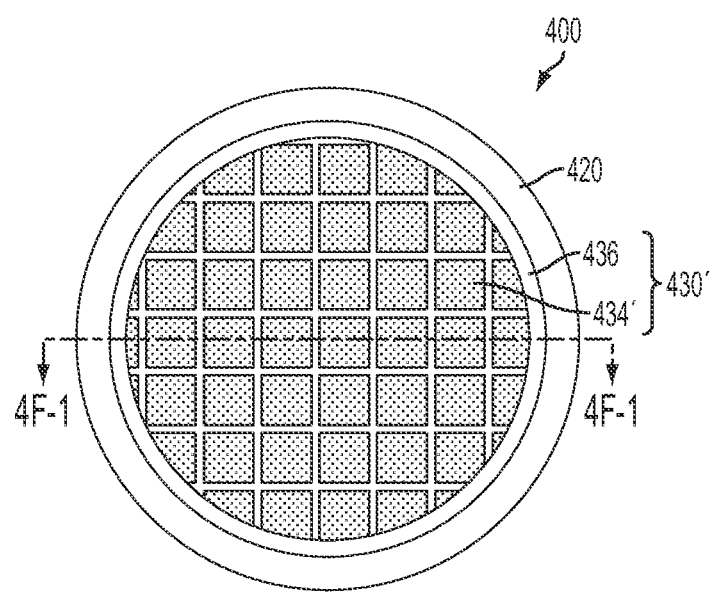

As depicted in FIGS. 4E-1 and 4E-2, an inner portion 434 of the layer of photoresist material 430 is selectively exposed to the electromagnetic radiation 481 by a lithographic process using a mask (operation 340). Then, as depicted in FIGS. 4F-1 and 4F-2, a removal process 490 is performed to remove the unexposed portion of the layer of photoresist material 430 at the edge portion 438 and the inner portion 434 (operation 350), and thus form a patterned photoresist layer 430' having a patterned inner portion 434' and the guard band portion 436. Subsequently, the layer 420 or the substrate 410 underneath the layer of photoresist material 430 is processed according to the patterned photoresist layer 430' (operation 360). In some embodiments, the wafer 400 is usable as the wafer 100 of FIG. 1. The inner portion 434 corresponds to the inner portion 134 in FIG. 1; the guard band portion 436 corresponds to the guard portion 136 in FIG. 1; and the edge portion 438 corresponds to the edge portion 138 in FIG. 1.

Figure 5:
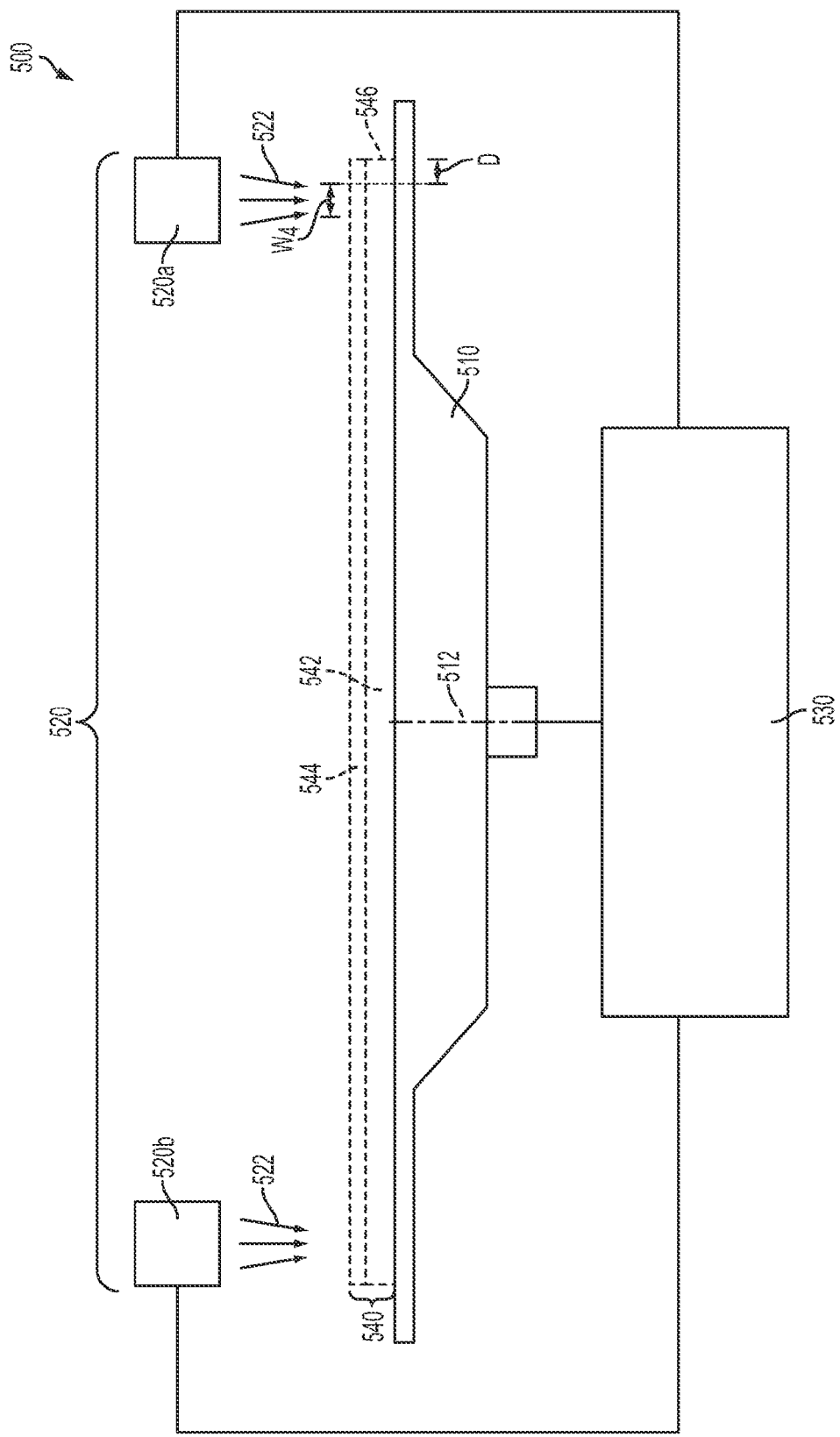
FIG. 5 is a block diagram of a wafer edge exposure (WEE) tool in accordance with one or more embodiments.

FIG. 5 is a block diagram of a wafer edge exposure (WEE) tool 500 usable in the process of emitting electromagnetic radiation to a guard band portion (such as guard band portion 136 or 436) in accordance with one or more embodiments. In at least one embodiment, the chuck 472 and the exposure unit 474 depicted in FIG. 4D-1 are a part of the WEE tool 500.

The WEE tool 500 includes at least a platform 510 (such as a chuck), an exposure unit 520, and a control module 530 communicatively connected to the platform 510 and the exposure unit 520. The platform 510 supports and/or rotates a wafer 540 around an axis 512 in order to position the wafer 540 relative to the exposure unit 520. In some embodiments, the platform 510 is usable as the chuck 472 of FIG. 4D-1, and the exposure unit 520 is usable as the exposure unit 474 of FIG. 4D-1.

The wafer 540 includes a substrate 542 and a layer of unexposed photoresist material 544. In some embodiments, the wafer 540 is usable as the wafer 100 of FIG. 1. The substrate 542 corresponds to the substrate 112 in FIG. 1, and the layer of unexposed photoresist material 544 corresponds to the photoresist layer 130 in FIG. 1. The exposure unit 520 has at least one electromagnetic radiation emitting device 520a and 520b, such as a light, x-ray, UV, or electron source that emits a beam of electromagnetic radiation 522. The beam of electromagnetic radiation 522 is controllable in width and shape. In at least some embodiments, control module 530 adjusts the shape, duration, exposure, position, and/or strength of the beam of electromagnetic radiation 522 emitted by exposure unit 520. The control module 522 directs the beam of electromagnetic radiation 522 at a predetermined distance D from a periphery 546 of the substrate 542 and avoids exposing an edge portion (such as the edge portion 138 depicted in FIG. 2) of the photoresist layer 544 to the beam of electromagnetic radiation 522. In some embodiments, the distance D corresponds to the width $W_2$ of the edge portion 138 depicted in FIG. 2 and ranges from 0.1 mm to 5.0 mm.

The beam of electromagnetic radiation 522 is capable of converting the unexposed photoresist material of the layer 544 into an exposed photoresist material. In some embodiments, the unexposed photoresist material is removable by a predetermined removal process, such as a photoresist development process, and the exposed photoresist material is not removable by the predetermined removal process. In some embodiments, the exposure unit 520 has two or more electromagnetic radiation emitting devices 520a and 520b communicatively connected to the control module 530. In some embodiments, the electromagnetic radiation emitting devices 520a and 520b are symmetrically positioned around the axis 512 of the platform 510.

In some embodiments, the WEE tool 500 is a stand-alone tool. In some other embodiments, one or more components similar to the nozzle 454 and/or the EBR tool 464 are also incorporated in the WEE tool 500, and the platform 510 is capable of acting as the chuck 452 or 462 as depicted in FIGS. 4B-1 and FIG. 4C-1, respectively.

In some embodiments, the beam width $W_4$ at an interface where the electromagnetic radiation reaches the photoresist layer ranges from 0.1 mm to 5.0 mm. In some embodiments, the beam width $W_4$ is controlled by emitting the electromagnetic radiation to a mask or by collimating the electromagnetic radiation with a lens.

In accordance with some embodiments, a method of forming a semiconductor structure includes forming a photoresist layer over a substrate. The photoresist layer includes a first material removable by a removal process. The first material at a guard band portion of the photoresist layer along an edge portion of the photoresist layer is converted to a second material. The second material is not removable by the removal process. The first material at the edge portion of the photoresist layer is not converted to the second material. The guard band portion is farther from a periphery of the substrate than the edge portion. The removal process is performed to remove the first material after the conversion of the guard band portion.

In accordance with some embodiments, a wafer edge exposure tool includes a platform, an exposure unit, and a control module. The platform is configured to support a substrate having a photoresist layer formed thereon, and the photoresist layer includes a first material removable by a removal process. The exposure unit is configured to emit electromagnetic radiation at the photoresist layer. The electromagnetic radiation is capable of converting the first material into a second material that is not removable by the removal process. The control module is coupled to the platform and the exposure unit. The control module is configured to direct the electromagnetic radiation at a predetermined distance from a periphery of the substrate and configured to avoid exposing an edge portion of the photoresist layer to the electromagnetic radiation.

In accordance with some embodiments, a semiconductor structure includes a substrate, a photoresist layer over the substrate. The photoresist layer includes and edge portion and a guard band portion. The edge portion has a first material dissolvable in a development solution. The guard band portion is positioned along the edge portion and has a second material non-dissolvable in the development solution. The guard band portion is farther from a periphery of the substrate than the edge portion of the photoresist layer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

The invention claimed is:

1. A method of forming a semiconductor structure, comprising:

forming a photoresist layer over a substrate, the photoresist layer including a first material removable by a removal process;

converting the first material at a guard band portion of the photoresist layer along an edge portion of the photoresist layer to a second material that is not removable by the removal process, and avoiding converting the first material at the edge portion of the photoresist layer to the second material, the guard band portion being farther from a periphery of the substrate than the edge portion, and the converting the first material at the guard band portion to the second material comprising rotating the substrate;

selectively exposing, by using a mask, an inner portion of the photoresist layer to electromagnetic radiation; and performing the removal process to concurrently remove the first material in the edge portion and in an unexposed portion of the inner portion after performing the converting operation and the selectively exposing operation, wherein a remaining portion of the inner portion after the removal process is configured as a layer of blocking material for construction of integrated circuit (IC) chips.

2. The method of claim 1, further comprising:

prior to the conversion of the guard band portion of the photoresist layer, trimming an edge-bead portion of the photoresist layer, the edge-bead portion of the photoresist layer being closer to the periphery of the substrate than the edge portion of the photoresist layer.

3. The method of claim 2, wherein the edge-bead portion of the photoresist layer has a width ranging from 0.1 mm to 5.0 mm.

4. The method of claim 1, wherein the edge portion of the photoresist layer has a width ranging from 0.1 mm to 5.0 mm.

5. The method of claim 1, wherein the guard band portion of the photoresist layer has a width ranging from 0.1 mm to 5.0 mm.

6. The method of claim 1, wherein the first material is a negative tone photoresist material.

7. The method of claim 6, wherein the negative tone photoresist material comprises a polymer having acrylate or methacrylate monomer.

8. The method of claim 1, wherein the removal process comprises:

dipping the semiconductor wafer in a development solution, wherein the first material is dissolvable in the development solution; and rinsing the semiconductor wafer to remove the development solution and dissolved first material.

9. The method of claim 8, wherein the development solution comprises an acetate-based solution.

10. A method, comprising:

forming a photoresist layer over a substrate;

causing a guard band portion of the photoresist layer to be exposed without causing an edge portion of the photoresist layer to be exposed, the guard band portion being farther from a periphery of the substrate than the edge portion, and the causing the guard band portion to be exposed comprising rotating the substrate;

causing, by using a mask, an inner portion of the photoresist layer to be selectively exposed; and performing a removal process to concurrently remove the edge portion and an unexposed portion of the inner portion, and leaving the exposed guard band portion and an exposed portion of the inner portion, wherein a remaining portion of the inner portion after the removal process is configured as a layer of blocking material for construction of integrated circuit (IC) chips.

11. The method of claim 10, wherein the forming the photoresist layer comprises:

forming a layer of photoresist material on the substrate by a spin-on process; and trimming an edge-bead portion of the layer of photoresist material.

12. The method of claim 10, wherein the edge portion of the photoresist layer has a width ranging from 0.1 mm to 5.0 mm.

13. The method of claim 10, wherein the guard band portion of the photoresist layer has a width ranging from 0.1 mm to 5.0 mm.

14. The method of claim 10, wherein the photoresist layer comprises a polymer having acrylate or methacrylate monomer.

15. The method of claim 10, wherein the removal process comprises:

dipping a structure, comprising the substrate and the photoresist layer formed thereon, in a development solution, wherein the edge portion of the photoresist layer is dissolvable in the development solution; and rinsing the structure to remove the development solution and the dissolved edge portion from the structure.

16. The method of claim 15, wherein the development solution comprises an acetate-based solution.

17. A method, comprising:

forming a structure comprising a photoresist layer over a substrate;

emitting a beam of electromagnetic radiation by an exposure unit;

exposing a guard band portion of the photoresist layer to the beam of electromagnetic radiation without exposing an edge portion of the photoresist layer, the guard band portion being farther from a periphery of the substrate than the edge portion, and the exposing the guard band portion comprising causing the structure to have a rotational movement;

selectively exposing, by using a mask, an inner portion of the photoresist layer to another electromagnetic radiation; and performing a removal process to concurrently remove the edge portion and an unexposed portion of the inner portion, and leaving the exposed guard band portion and an exposed portion of the inner portion, wherein a remaining portion of the inner portion after the removal process is configured as a layer of blocking material for construction of integrated circuit (IC) chips.

18. The method of claim 17, wherein the edge portion of the photoresist layer has a width ranging from 0.1 mm to 5.0 mm.

19. The method of claim 17, wherein the guard band portion of the photoresist layer has a width ranging from 0.1 mm to 5.0 mm.

* * * * *